(12) United States Patent
Kim et al.

(10) Patent No.: US 6,423,373 B1
(45) Date of Patent: Jul. 23, 2002

(54) SURFACE TREATED ALUMINUM NITRIDE AND FABRICATING METHOD THEREOF

(75) Inventors: Hyoun Ee Kim, Daewoo Apt. 1-308, Bangbae-Dong, Seocho-Ku; Young Hag Koh, both of Seoul (KR)

(73) Assignee: Hyoun Ee Kim, Seoul (KR)

( * ) Notice: Subject to any disclaimer, the term of this patent is extended or adjusted under 35 U.S.C. 154(b) by 0 days.

(21) Appl. No.: 09/477,536

(22) Filed: Jan. 4, 2000

(30) Foreign Application Priority Data

Jun. 14, 1999 (KR) .............................................. 99/21995

(51) Int. Cl.⁷ ............................................. C23C 16/455
(52) U.S. Cl. ........................... 427/255.18; 427/255.21; 427/255.37
(58) Field of Search ...................... 427/255.18, 255.21, 427/255.37; 204/192.16, 192.23

(56) References Cited

U.S. PATENT DOCUMENTS 5,610,105 A * 3/1997 Vines et al.
5,696,386 A * 12/1997 Yamazaki
5,849,162 A * 12/1998 Bartolomei et al.
6,037,002 A    3/2000 Hintermaier

FOREIGN PATENT DOCUMENTS

| JP | 64-83585 | 3/1989 |
| JP | 1-196149 | 8/1989 |
| JP | 6/236873 | 8/1994 |
| JP | 8-12472 | 1/1996 |
| JP | 11-71675 | 3/1999 |

\* cited by examiner

Primary Examiner—Timothy Meeks
(74) Attorney, Agent, or Firm—Scully, Scott, Murphy & Presser

(57) ABSTRACT

The present invention relates to a surface-treated aluminum nitride and fabrication method thereof. The flexural strength of a surface-treated aluminum nitride at a high temperature is improved by restraining an oxidation behavior. The restraint of oxidation behavior is due to a silica layer formed on the surface-treated aluminum nitride by reaction of a source of silicon with an atmosphere gas.

13 Claims, 5 Drawing Sheets

SURFACE TREATED ALUMINUM NITRIDE AND FABRICATING METHOD THEREOF

BACKGROUND OF THE INVENTION

1. Field of the Invention

The present invention relates to a ceramic material and a fabrication method thereof, and in particular to a surface-treated ceramic material showing an increased strength and an oxidation-resistance and a fabrication method thereof.

2. Description of the Background Art

Aluminum nitride AlN has many attractive properties for electronic applications, such as high thermal conductivity, low thermal expansion coefficient, and high electrical resistivity. In addition, the AlN has low specific gravity, high-melting temperature, and high resistance to molten metals. A combination of these thermo-physical properties makes this ceramic for a strong candidate material for a variety of structural applications, such as parts for heat-engine, crucible materials for molten aluminum or gallium arsenide, and airborne ballistic armor materials.

The potentials of AlN, however, have not been fully utilized yet. One of the reasons limiting its wider applications is a low oxidation resistance of AlN at elevated temperatures. There have been many investigations on the oxidation behavior of AlN in various environments. In spite of some discrepancies in detail, it is generally agreed that the oxidation rate of AlN above 1000° C. is so high in oxidizing atmospheres, such as in air, that a thick alumina layer is formed on the surface. Flaws generated on the alumina layer because of the thermal expansion mismatch between the alumina layer and the AlN substrate penetrate into the substrate, leading to a severe reduction in strength of the material. Therefore, for successful application at elevated temperatures, the oxidation resistance of this ceramic should be improved.

SUMMARY OF THE INVENTION

Accordingly, it is an object of the present invention to provide a surface-treated aluminum nitride and a fabrication method thereof which are capable of preventing oxidation behavior at an elevated temperature and of providing stable strength at an even elevated temperature.

It is another object of the present invention to provide a surface-treated aluminum nitride and a fabrication method thereof which are capable of surface-treating a lot of specimen at a time and conveniently.

To achieve the above objects, there is provided a surface-treated aluminum nitride including a silica layer formed on the aluminum nitride.

In another aspect, the present invention contemplates a method for fabricating a surface-treated aluminum nitride, comprising the step of depositing a silica by reacting a source of silicon with an atmosphere gas including oxygen or oxygen compound.

Additional advantages, objects and features of the invention will become more apparent from the description which follows.

BRIEF DESCRIPTION OF THE DRAWINGS

The present invention will become more fully understood from the detailed description given below and the accompanying drawings, which are given by way of illustration only and are not limitative of the present invention, and wherein.

DETAILED DESCRIPTION OF THE PREFERRED EMBODIMENTS

In the present invention, a silica $SiO_2$ layer is formed on an aluminum nitride to increase the high-temperature-strength of an aluminum nitride. It is because the permeation or diffusion of oxygen through $SiO_2$ is extremely low.

There are several methods such as chemical vapor deposition, sputtering, evaporation and physical vapor deposition with which silica is deposited on an aluminum nitride. Particularly, an embodiment provides a below-described method which is capable of forming a lot of silica at a time and conveniently.

Figure 1:
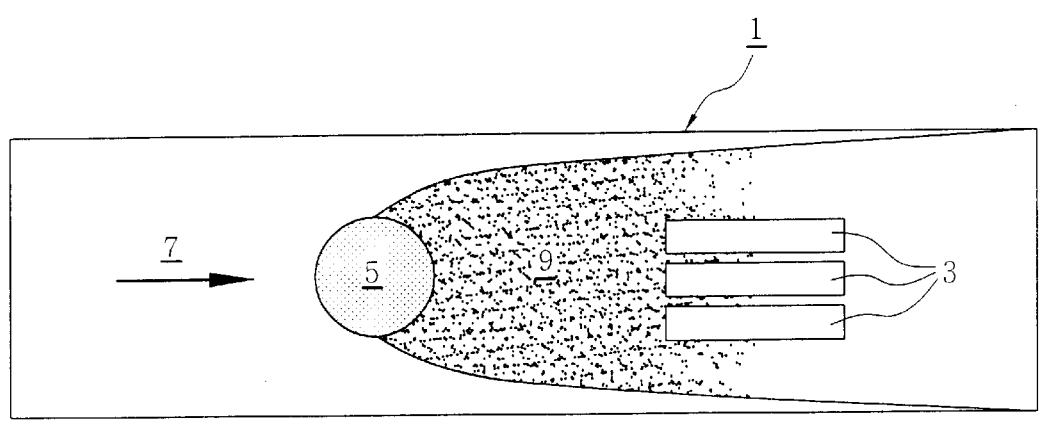
FIG. 1 illustrates a reaction furnace in which the surface treatment of aluminum nitride specimens is carried out.

FIG. 1 illustrates a reaction furnace in which the surface treatment of an aluminum nitride is carried out.

It is possible to control the temperature of the reaction furnace 1 with a heat source(not shown) attached to the reaction furnace 1. A gas including oxygen element such as $H_2O$, $O_2$, $CO_2$ and CO etc. is used as a source of oxygen and a gas such as $H_2$, $N_2$, and Ar etc. is used as a gas controlling the partial pressure of oxygen element. Particularly, in the present embodiment, a mixture gas of $H_2O$ and $H_2$ is used as an atmosphere gas 7 and the atmosphere gas 7 is supplied into the reaction furnace 1. It is preferable for the atmosphere gas 7 to include above 0.05 vol % $H_2O$ in consideration of the partial pressure of oxygen element. A source of silicon 5 in the form of powder and aluminum nitride specimens 3 are provided in the reaction furnace. A variety of materials including silicon element such as SiC, $Si_3N_4$, Si, Sialon and $SiO_2$ etc. can be used as the source of silicon. Particularly, in the present invention, SiC powder is used as the source of silicon 5.

A fabrication method of a surface-treated aluminum nitride in accordance with the preferred embodiment of the present invention will now be described.

Firstly, aluminum nitride specimens 3 and SiC powder 5 is provided in the reaction furnace 1. At this time, the SiC powder 5 is located in an upper stream of the atmosphere gas 7 than the aluminum nitride specimens 3 in consideration of the direction of the atmosphere gas stream, which is for a silicon oxide $SiO_x$ gas 9 generated by the reaction of the SiC powder 5 with the atmosphere gas 7 to flow smoothly and to be deposited on the surface of the aluminum nitride specimens. Particularly, in the present embodiment, the aluminum specimens 3 are located at a distance of 1 cm~10 cm and at an angle of 5°~50° from the SiC powder 1 for a uniform deposition of the silica.

Next, the temperature of the reaction furnace 1 is maintained at 1000° C.~1800° C. for hours with the heat source (not shown). As a result, the silicon oxide gas 9 is generated by the reaction of the SiC powder 5 with the atmosphere gas 7. The silicon oxide gas 9 flows in the same direction of the atmosphere gas 7 stream and is deposited on the aluminum nitride specimens 3 to be a silica layer.

The following experiments were carried out to investigate the properties of a surface-treated aluminum nitride according to the present embodiment.

The aluminum nitride specimens according to the present embodiment were prepared by hot-pressing a commercially available AlN powder(Grade C, H. C. Stark, Berlin, Germany) with an addition of 1 mol % $Y_2O_3$ (Grade C, H. C. Stark, Berlin, Germany) as a sintering aid. The hot pressing was carried out at 1800° C. for 1 hour with an applied pressure of 20 MPa in a flowing nitrogen atmosphere.

From the sintered body, specimens with the dimensions of 3×4×25 mm were cut out to determine the weight changes during the oxidation and the variations in strength after a surface treatment. The material was ground with a 200-grit diamond abrasive wheel and subsequently polished with diamond pastes down to 1 micron. The long edges of the tensile face of each bar were lightly beveled on a 6-micrometer-grit diamond lap to minimize the effect of stress concentration due to machining flaws.

Groups of at least five specimens were placed in a resistance-heated reaction furnace 1 next to a bed of SiC powder 5 (HCST GmbH & Co., Berlin, Germany), as schematically shown in FIG. 1, and heated at 1450° C. for up to 2 hours. The atmosphere was a flowing $H_2$ gas (~0.9 cm/sec) at a pressure slightly greater than 1 atm and having a $P_{H2O}$ of $1 \times 10^{-3}$ atm. The $H_2$ gas was purified by passing it through columns of $Ca_sO_4$ and activated alumina. The PH20 of the atmosphere was controlled by bubbling the purified H2 through a column of distilled water. After the exposure, the formation of silica layer was confirmed by the X-ray Diffraction (hereinafter, referred to as 'XRD') analyses and Scanning Electron Microscopy (hereinafter, referred to as 'SEM') observation.

To be compared with the properties of aluminum nitride specimens surface-treated according to the above-described embodiment, non-surface-treated aluminum nitride specimens are prepared.

Effects of the silica layer on the strength variations were determined by four-point bend tests, with a cross-head speed of 0.05 mm/min, and inner and outer spans of 10 mm and 20 mm, respectively.

Surface-treated specimens and non-surface-treated specimens were oxidized in air at temperatures of 1000° C. to 1400° C. for various periods of time up to 100 hours. The effects of silica layer on the oxidation resistance were estimated by measuring the weight changes of the specimens during the oxidation processes. The strength retention after the oxidation were also measured and correlated to the oxidation rate and the oxidation product formed on the specimens.

Figure 2A:
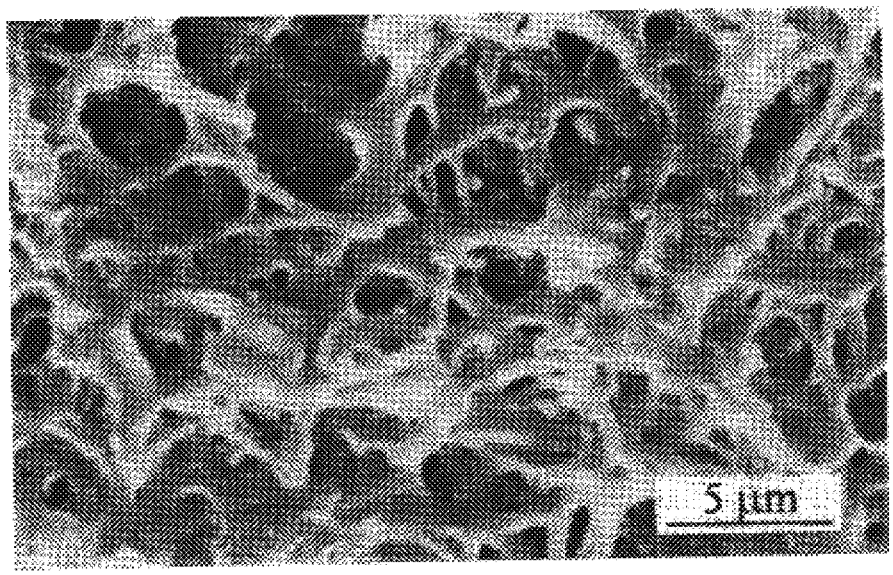
FIGS. 2A–2B are SEM micrographs illustrating the surface of an aluminum nitride surface-treated in accordance with an embodiment of the present invention.
Figure 2B:
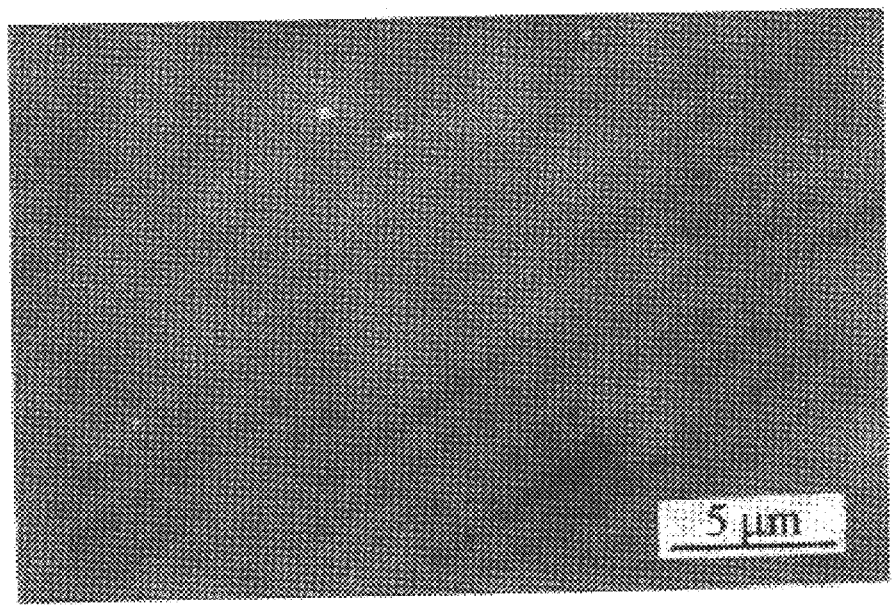

FIGS. 2A~2B are SEM micrographs illustrating the surface of aluminum nitride specimens surface-treated in accordance with the present embodiment. FIG. 2A illustrates the surface of an aluminum nitride specimen surface-treated for 30 minutes, and FIG. 2B illustrates the surface of an aluminum nitride specimen surface-treated for 1 hour.

Densities of all the hot-pressed AlN specimens measured by an immersion technique were higher than 98% of the theoretical value. SEM observation on a polished surface of the non-surface-treated specimens showed no feature except for the presence of small pores. When the specimens were exposed to $H_2$—$H_2O$ atmosphere gas 7 with the presence of SiC powder 5 at 1450° C. for a half hour, a fibrous reaction product was formed on the surface, as illustrated in FIG. 2A. When the exposure time was extended to 1 hour, a dense layer was formed on the surface as illustrated in FIG. 2B.

When the AlN specimens are placed in the $SiO_2$ smoke region 9, as schematically illustrated in FIG. 1, part of the smoke was deposited on the surface of the AlN specimens. During the early stage of the deposition, the fibrous $SiO_2$ is formed on the surface as illustrated in FIG. 2A. With further deposition, the surface of the AlN specimens was completely covered with a dense and uniform $SiO_2$ as illustrated in FIG. 2B.

The layer deposited on the AlN specimens was analyzed with XRD patterns. The XRD patterns of the non-surface-treated specimens indicates that there are small amounts of $Al_2O_3$.-AlN (γ-ALON) and $5Al_2O_3.3Y_2O_3$(YAG) as second phases as well as AlN. After the surface-treatment according to the present embodiment, the XRD patterns was basically not changed, except for a very weak $SiO_2$(cristobalite) peak.

As described above, the longer the surface treatment the denser the silica layer deposited on the AlN specimens. The silica layer generates a flaw-blunting phenomenon, which makes sharp flaws existing on the surface of non-surface-treated AlN specimens blunt and improves the strength of the specimens. In addition to that, the silica layer prevents the penetration of oxygen or vapor into the AlN specimens, which restrains an oxidation behavior of the AlN specimens.

Figure 3:
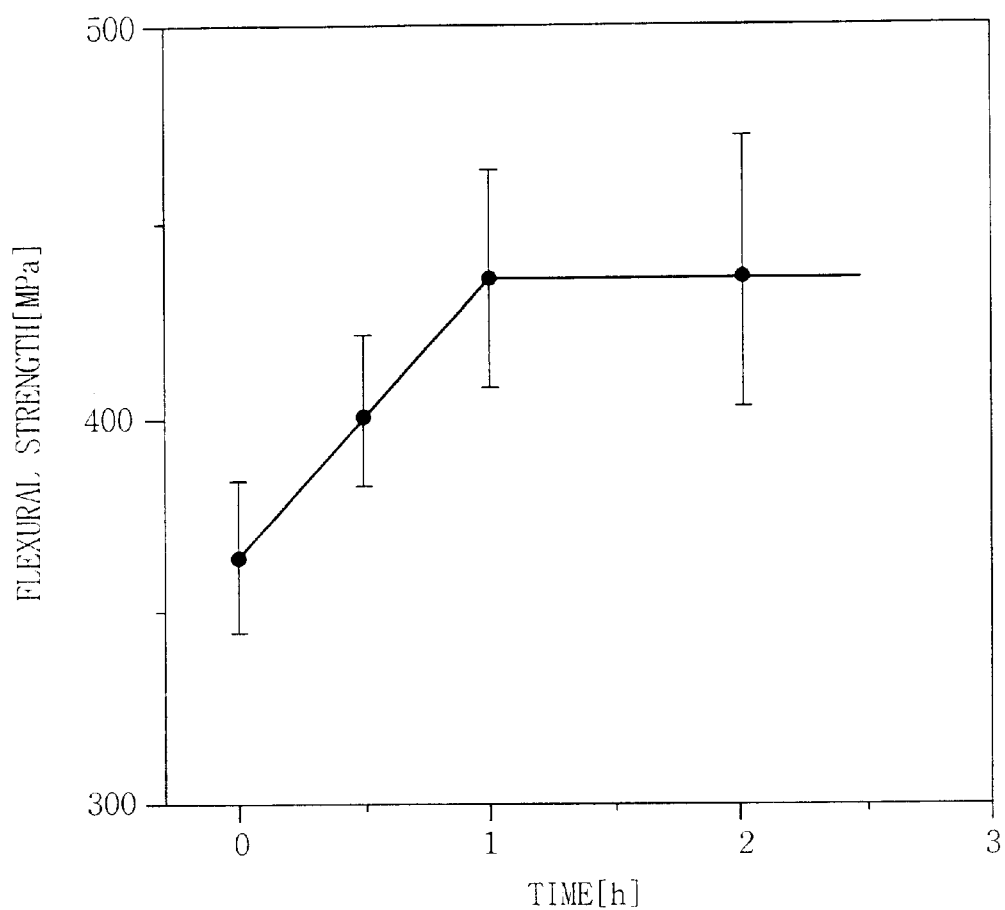
FIG. 3 is a graph illustrating the flexural strength variation of an aluminum nitride according to increases of surface treatment time in accordance with an embodiment of the present invention.

FIG. 3 is a graph illustrating the flexural strength variation of an aluminum nitride according to increases of surface treatment time in accordance with the present embodiment.

As illustrated in FIG. 3, the flexural strength of AlN specimen began to increase right after the surface treatment and increases at a constant rate until the surface treatment time reaches to an hour. However, the AlN specimen surface-treated for above 1 hour showed the same strength as that of AlN specimen surface-treated for an hour.

The above-mentioned increases of the flexural strength relate to the flaw-blunting phenomenon. As illustrated in FIGS. 2A and 2B, the flaws on the surface are remarkably decreased in number during the surface treatment for up to 1 hour. As a result, the flexural strength of AlN specimen was improved by about 20% after surface treatment for 1 hour in comparison with that of non-surface-treated AlN specimen. In contrast to that, since the silica layer covers the AlN specimen almost completely after surface treatment for an hour, further improvement of flexural strength did not occur when surface treatment was carried out for above an hour. These results indicate that the thickness of the $SiO_2$ layer is not an important factor, implying the strengthening effect is mainly due to the blunting of surface flaws.

Figure 4A:
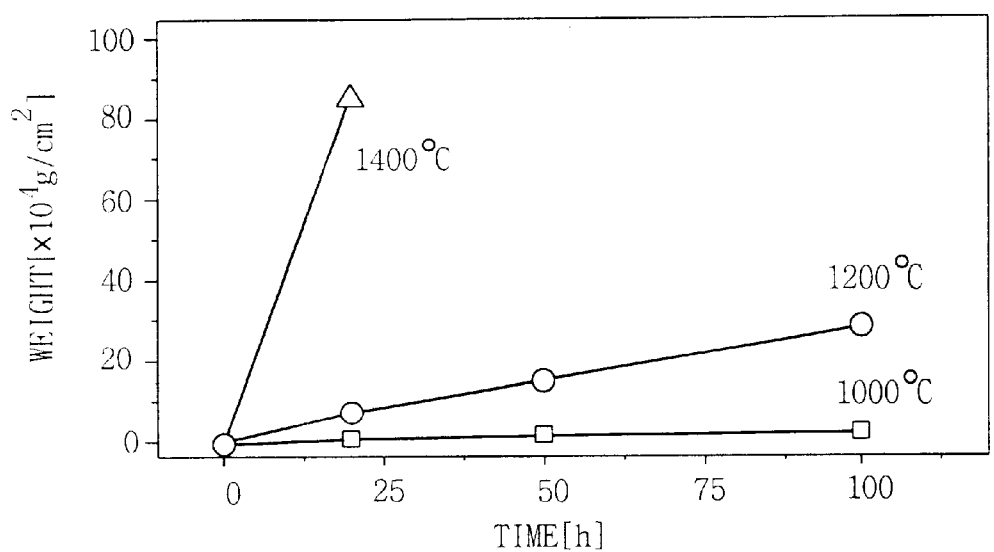
FIG. 4A is a graph illustrating the weight variations of non-surface-treated aluminum nitride specimens when exposed at elevated temperatures of 1000° C. to 1400° C.
Figure 4B:
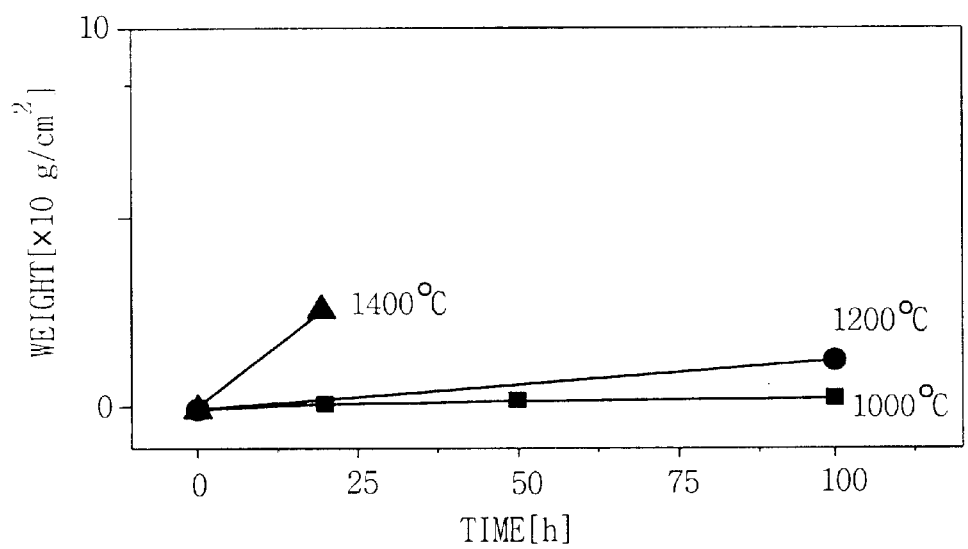
FIG. 4B is a graph illustrating the weight variations of aluminum nitride specimens surface-treated in accordance with an embodiment of the present invention when exposed to elevated temperatures of 1000° C. to 1400° C.

FIGS. 4A and 4B are graphs illustrating the weight variations of a non-surface-treated aluminum nitride and a surface-treated aluminum nitride respectively with increases of exposure time at elevated temperatures of 1000° C.~1400° C.

As for a non-surface-treated aluminum nitride exposed at 1200° C., the weight of a specimen increases in proportion to an exposure time as illustrated in FIG. 4A. This behavior of a non-surface-treated aluminum nitride represents the formation of an alumina layer that results from the oxidation of aluminum nitride.

In contrast to that, the weight of an aluminum nitride surface-treated according to the present embodiment is not increased abruptly even after exposure at 1400° C. That is due to the fact that a silica layer formed on the surface of a surface-treated aluminum nitride restrains an oxidation behavior effectively. A silica layer prevents oxidants such as oxygen and vapor from penetrating into an aluminum nitride.

Figure 5A:
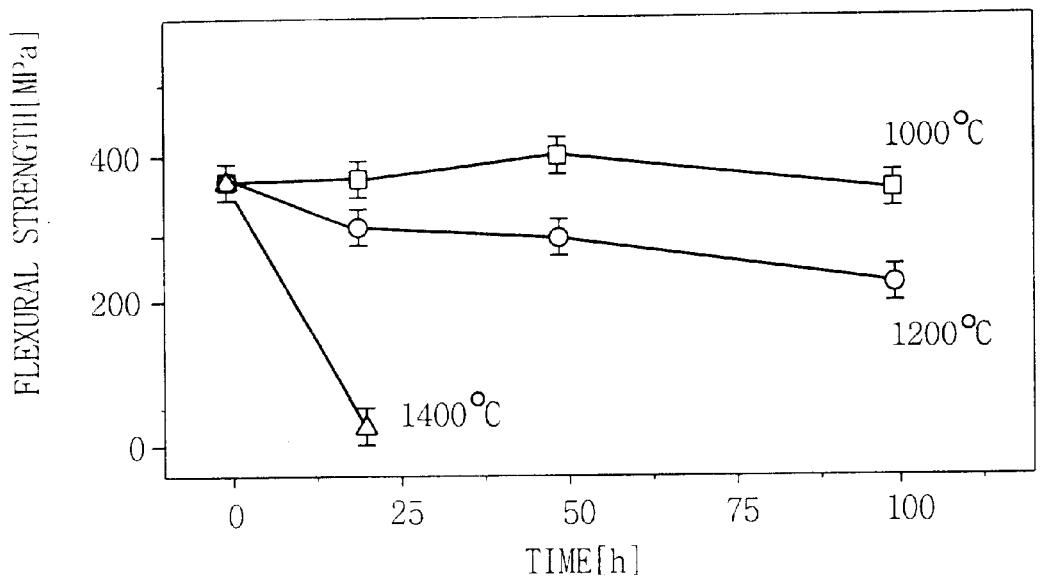
FIG. 5A is a graph illustrating the flexural variations of non-surface-treated aluminum nitride specimens when exposed to elevated temperatures of 1000° C. to 1400° C.
Figure 5B:
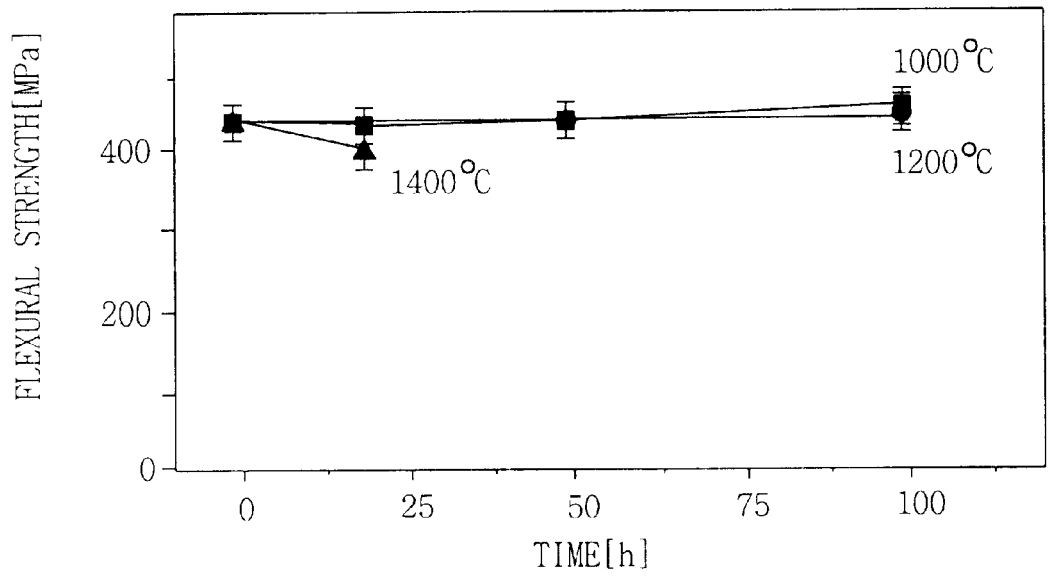
FIG. 5B is a graph illustrating the flexural variations of aluminum nitride specimens surface-treated in accordance with an embodiment of the present invention when exposed to elevated temperatures of 1000° C. to 1400° C.

FIGS. 5A and 5B are graphs illustrating the flexural strength variations of non-surface-treated aluminum nitride and a surface-treated aluminum nitride respectively with increases of exposure time at elevated temperatures of 1000° C.~1400° C.

As for a non-surface-treated aluminum nitride exposed at 1000° C., the flexural strength of a specimen decreases in proportion to an exposure time as illustrated in FIG. 5A. Moreover, as the exposure temperature goes higher, the decrease of flexural strength was remarkable. There happens an abrupt decrease of flexural strength after exposure at an elevated temperature of 1400° C., which is due to an alumina layer formed on the surface of aluminum nitride. Since the thermal expansion coefficient of alumina is much different from that of aluminum nitride, there happen surface cracks between the alumina layer and the aluminum nitride. Those surface cracks penetrate into the aluminum nitride and decrease the flexural strength of the aluminum nitride.

In contrast to that, as illustrated in FIG. 5B, there happens almost no decrease of flexural strength in the case of surface-treated aluminum nitride after exposure at up to 1200° C. An abrupt decrease of flexural strength does not occur even after exposure at an elevated temperature of 1400° C., which is due to the fact that a silica layer formed on the surface of aluminum nitride effectively restrains oxidation behavior by preventing oxidants such as oxygen and vapor from penetrating into aluminum nitride. As a result, there happened no cracks resulting from the difference of thermal expansion coefficient between an alumina layer and an aluminum nitride.

A surface-treated aluminum nitride and a fabrication method thereof according to the present invention have several advantages. First, since oxidation behavior at an elevated temperature is prevented, an aluminum nitride can maintain a high value of flexural strength.

In addition, the flexural strength of aluminum nitride is increased by a flaw-blunting phenomenon.

Further, since the method of a surface treatment according to the present invention is capable of surface-treating a lot of specimens at a time and conveniently, it is possible to reduce a unit cost of product.

It will be apparent to those skilled in the art that various modifications and variations can be made to a sintered ceramic composite implant material, and the preparation method thereof, embodying the present invention without departing from the spirit or scope of the invention. Thus, it is intended that the present invention covers the modifications and variations of this invention provided they come within the scope of the appended claims and their equivalents.

The foregoing embodiments are merely exemplary and/or illustrative, and the description given herein is not intended to limit the scope of the claims. Many alternatives, modifications, and variations will be apparent to those skilled in the art.

What is claimed is:

1. A method for fabricating aluminum nitride having improved strength, comprising the steps of:
   providing at least one aluminum nitride specimen in a reaction furnace;
   providing a source of silicon in powder form in the reaction furnace;
   providing an atmosphere gas comprising at least an oxygen element and a gas for controlling the partial pressure of the oxygen element in the reaction furnace;
   reacting the source of silicon with the atmosphere gas by controlling the temperature of the reaction furnace to generate silicon oxide gas, said silicon oxide gas flowing in the same direction as the atmosphere gas; and
   depositing the silicon oxide gas on the aluminum nitride specimen to form a silica layer thereon.

2. A method for fabricating aluminum nitride according to claim 1, wherein the atmosphere gas flows toward the aluminum nitride specimen via the source of silicon.

3. A method for fabricating aluminum nitride according to claim 1, wherein the source of silicon is located at an upper stream of the atmosphere gas than the aluminum nitride specimen in consideration of the direction of the atmosphere gas stream.

4. A method for fabricating aluminum nitride according to claim 1, wherein the source of silicon comprises silicon or a silicon compound.

5. A method for fabricating aluminum nitride according to claim 4, wherein the silicon compound comprises at least one of SiC, $Si_3N_4$, Sialon and $SiO_2$.

6. A method for fabricating aluminum nitride according to claim 1, wherein the oxygen element comprises at least one of $H_2O$, $O_2$, $CO_2$ and CO.

7. A method for fabricating aluminum nitride according to claim 1, wherein the gas for controlling the partial pressure of the oxygen element comprises at least one of $H_2$, $N_2$ and Ar.

8. A method for fabricating aluminum nitride according to claim 1, wherein the atmosphere gas is a mixture of $H_2O$ and $H_2$.

9. A method for fabricating aluminum nitride according to claim 8, wherein the $H_2O$ occupies over 0.05 vol % in the atmosphere gas.

10. A method for fabricating aluminum nitride according to claim 1, wherein the temperature of the reaction furnace is controlled to be at 1000° C. to 1800° C.

11. A method for fabricating aluminum nitride according to claim 1, wherein the aluminum nitride specimen and the source of silicon are separated by a distance of 1 cm to 10 cm.

12. A method for fabricating aluminum nitride according to claim 1, wherein the aluminum nitride specimen and the source of silicon are separated by an angle that is from 5° to 10°.

13. A method for fabricating aluminum nitride according to claim 1, wherein the atmosphere gas has a flow rate that is maintained at a constant value.

* * * * *